United States Patent [19]
Tan et al.

[11] Patent Number: 5,490,043
[45] Date of Patent: Feb. 6, 1996

[54] GROUNDING CLIP STRUCTURE OF I/O CARD

[75] Inventors: Haw-Chan Tan, Diamond Bar; Vincent Chen, Walnut; Frank C. Ma, Diamond Bar, all of Calif.

[73] Assignee: Hon Hai Precision Ind. Co., Ltd., Taiwan

[21] Appl. No.: 228,141

[22] Filed: Apr. 15, 1994

[51] Int. Cl.[6] .................................................. H05K 9/00
[52] U.S. Cl. ........................... 361/818; 361/737; 439/946
[58] Field of Search ................................ 439/92, 95, 76, 439/946; 235/492; 361/737, 818; 174/35 R

[56] References Cited

U.S. PATENT DOCUMENTS

| | | | |
|---|---|---|---|
| 5,235,492 | 8/1993 | Humbert et al. | 361/818 |
| 5,319,516 | 6/1994 | Perkins | 361/220 |
| 5,333,100 | 7/1994 | Anhalt et al. | 361/818 |
| 5,339,222 | 8/1994 | Simmons et al. | 361/818 |

FOREIGN PATENT DOCUMENTS 1-201999  8/1989  Japan .................................. 174/35 R

*Primary Examiner*—Neil Abrams

[57] ABSTRACT

An I/O card (1) includes a rectangular frame (10) sandwiched between a top cover (11) and a bottom cover (13). Connector means (16, 18) are positioned at the ends of the I/O card (1) to form an in-and-out interface, and is mounted on a PC board (28) in the I/O card (1). A pair of top and bottom grounding clips (40, 30) are respectively attached on two opposite sides of the frame (10) and electrically and mechanically engage the top surface (29) and the bottom surface (27) of the inner PC board (28), respectively, wherein both grounding clips (30, 40) can be pre-assembled with the frame (10) and the bottom cover (13) as a semi-finished product which is delivered to an I/O card manufacturer who assembles the internal PC board (28) and the associated interface connectors (16, 18) to such pre-assembly without any interference from either of the grounding clips (30, 40) and successively places a top cover (11) thereon to complete the final product. In this situation, the top grounding clip (40) can be deformably depressed downward by the top cover (11) to electrically and mechanically contact the top surface (29) of the internal PC board (28) for grounding.

15 Claims, 5 Drawing Sheets

GROUNDING CLIP STRUCTURE OF I/O CARD

BACKGROUND OF THE INVENTION

1. Field of the Invention

The invention relates to grounding structure for use with I/O cards, particularly to a clip type grounding means which can be attached to the frame of the I/O card before an inner PC board is assembled within such I/O card.

2. The Prior Art

IC cards, memory cards or I/O cards were popularly used in the recent years. The basic structure of such card includes generally a rectangular frame enclosing therein a PC board having electronic components mounted thereon for signal processing, and a pair of top and bottom covers attached to such frame for shielding such internal PC board therein not to expose to the outside. For circuit design consideration, the surfaces of the inner PC board, including the top and the bottom ones, generally have grounding paths thereof, so that some grounding tangs or clips, which are connected to the metal top or bottom covers, are designedly engaged thereto for electricity transmission through such metal covers of the card. A basic structure of an I/O card can be referred to U.S. Pat. Nos. 5,038,250, 5,061,845, 5,207,856 and 5,242,310.

As a matter of fact, most I/O or IC card manufacturers are PC board manufacturers who are familiar at and fabricate the inner PC board, and generally tend to buy the other parts of the card from outside part vendors in an OEM process. In other words, the outside vendor tries to make and assemble the most parts of the I/O card beforehand, and then the card manufacturer attaches the PC board to such semi-finished pre-assembly, and successively assembles the rest parts, such as the top cover, onto such I/O card to obtain a complete and final product. It can be understood that from a viewpoint of the I/O card manufacturer, it is desired to have most portions of such semi-finished I/O card pre-assembly done by the outside vendor before he can assemble his own PC board thereto for consideration of time and labor saving. In contrast, the outside vendor who makes the most parts of such I/O card, intends to save the scraps of the raw material and lower the cost when he produces and assembles the basic structure of such I/O card Under the situation that he is asked to make such semi-finished I/O card pre-assembly.

One thing which may disturbs the aforementioned part vendor, is that the means for grounding the circuit traces on the top surface of the inner PC board is required by some I/O card manufacturers. If such grounding means is in a form of tang which directly integrally extends from the top cover, as shown in some existing products, to contact the top surface of the PC board, it will not have any inconveniences to the I/O card manufacturer for assembling the PC board onto such pre-assembly and put the top cover thereon, but such grounding tang, which integrally extends from the top cover, will complicate the fabrication procedure of such top metal cover of the I/O card wherein such top cover is made from a metal plate by stamping and forming and/or bending. Additionally, such tang integrally extending from the top cover will increase scraps in raw material. In contrast, if such grounding means is in a form of a separate clip which is independently fastened to the frame of the I/O card, it will be easier to make such top cover and prevent excess scraps during stamping and forming process in manufacturing such top cover, while it is generally inevitably required for such independent grounding clip for grounding the circuit traces on the top surface of the PC board that only after the PC board has been installed into such I/O card, such separate grounding clip can be secured to the frame of the I/O card and electrically and mechanically press against the top surface of such PC board. Otherwise, an pre-assembled existing grounding clip for circuit traces on the top surface of the PC board will hinder the top-loading installation of such PC board into the frame of the I/O card. Some manufacturers dislike such separate grounding clip in their I/O card because it will take their labor and time, and may preclude their whole assembling procedure from automation only for the step of installation of such grounding clip to the I/O card, but as mentioned before, from a viewpoint of the part vendor, such separate grounding clip can save their cost and is a preferred choice. The present invention is to provide a solution of this contradiction.

An object of the invention is to provide a separate grounding clip for circuit traces on the top surface of the inner PC board in an I/O card, which can be pre-assembled to the frame of the I/O card in the part vendor's place as one part of the semi-finished pre-assembled I/O card, and then the I/O manufacturer can assemble the internal PC board to such semi-finished pre-assembly without any obstruction resulting from such grounding clip while such ground clip can press tightly against the top surface of the corresponding PC board for grounding in the final completed I/O card after the top cover is assembled thereto.

SUMMARY OF THE INVENTION

According to an aspect of the invention, an I/O card includes a rectangular frame sandwiched between a top cover and a bottom cover. Connector means is positioned either end of the I/O card for being an in-and-out interface, and is mounted on a PC board in the I/O card. A pair of top and bottom grounding clips are respectively attached on two opposite sides of the frame and electrically and mechanically engage the top surface and the bottom surface of the inner PC board, respectively, wherein both grounding clips can be pre-assembled with the frame and the bottom cover as a semi-finished product which is delivered to an I/O card manufacturer who loads the internal PC board and the associated interface connectors to such pre-assembly without any interference from either of the grounding clips and successively places a top cover thereon to complete the final product. In this situation, the top grounding clip can be deformably depressed downward by the top cover to electrically and mechanically contact the top surface of the internal PC board for grounding.

DETAILED DESCRIPTION OF THE PREFERRED EMBODIMENT

References will now be made in detail to the preferred embodiments of the invention. While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by appended claims.

Figure 1:
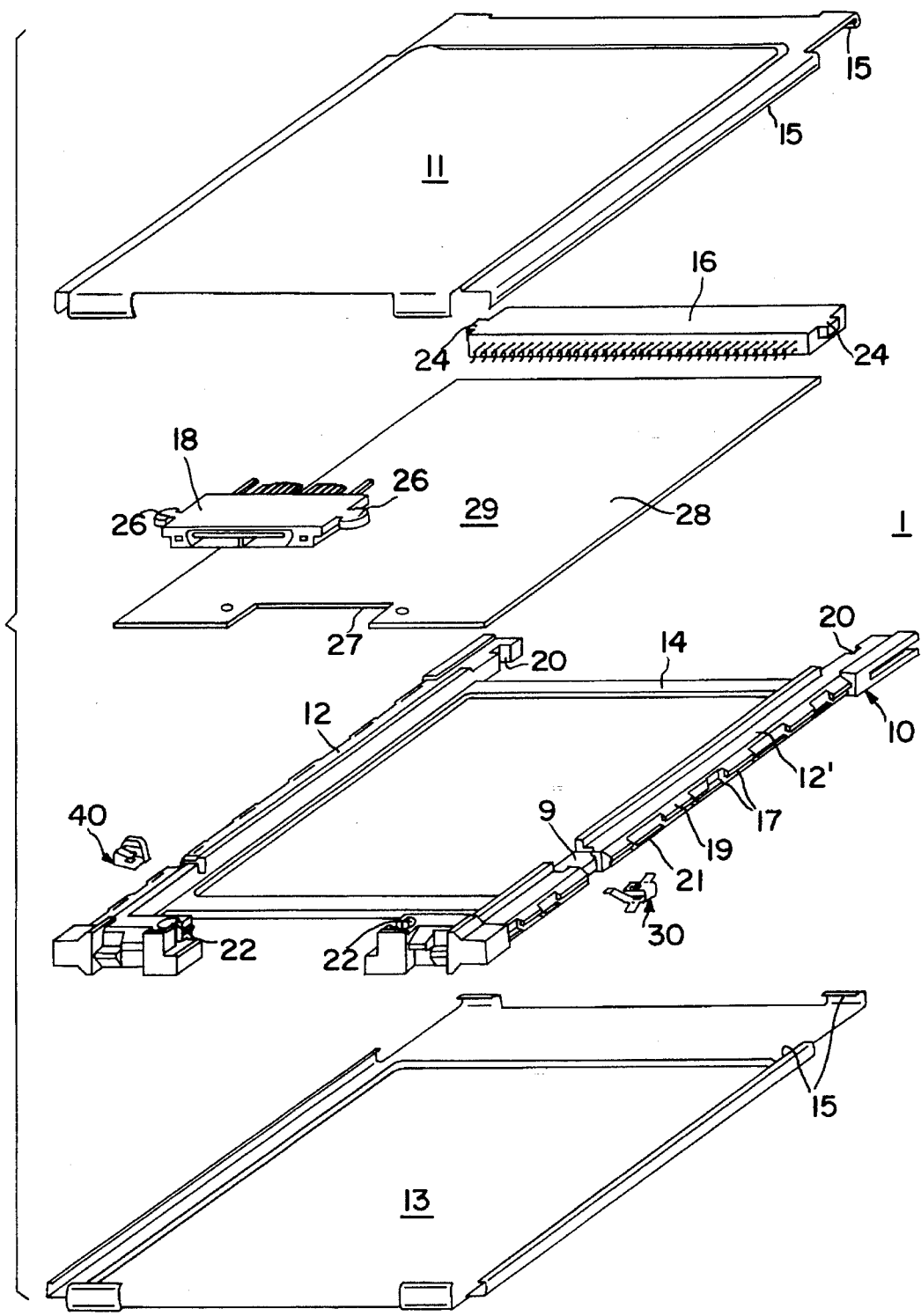
FIG. 1 is an exploded perspective view of a presently preferred embodiment of an I/O card assembly according to the invention.

It will be noted here that for a better understanding, like components are designated by like reference numerals throughout the various figures in the embodiment. Attention is now directed to FIG.1 wherein an I/O card assembly 1 includes a generally rectangular frame 10 comprised of two opposite side arms 12, 1' and a frame-like base 14 integrally extending between the two side arms 12, 12'. A top cover 11 and a bottom cover 13 are respectively, on the top and on the bottom, fastened to the frame 10 by means of plural hooks 15, which extend inwardly from edges thereof, captured within corresponding slots 17 defined by the upper row protrusions 19 and the lower row protrusions 21 on the periphery of the frame 10.

A socket connector 16 and an I/O connector 18 are respectively positioned at two opposite ends of the I/O card 1 wherein two pairs of cavities 20, 22 respectively positioned at two opposite ends of two opposite side arms 12 for respectively retainably receiving two pairs of corresponding engaging ears 24, 26 respectively positioned at two opposite ends of the connectors 16 and 18. An internal PC board 28 is attachably seated on the base 14 of the frame 10 and between the top and the bottom covers 11, 13, on which the connectors 16 and 18 are mechanically mounted and electrically connected on two opposite edge portions thereof so that through the internal PC board 28, the connectors 16 and 18 are respectively interfaces for connection between the computer set and the periphery cable.

Figure 2:
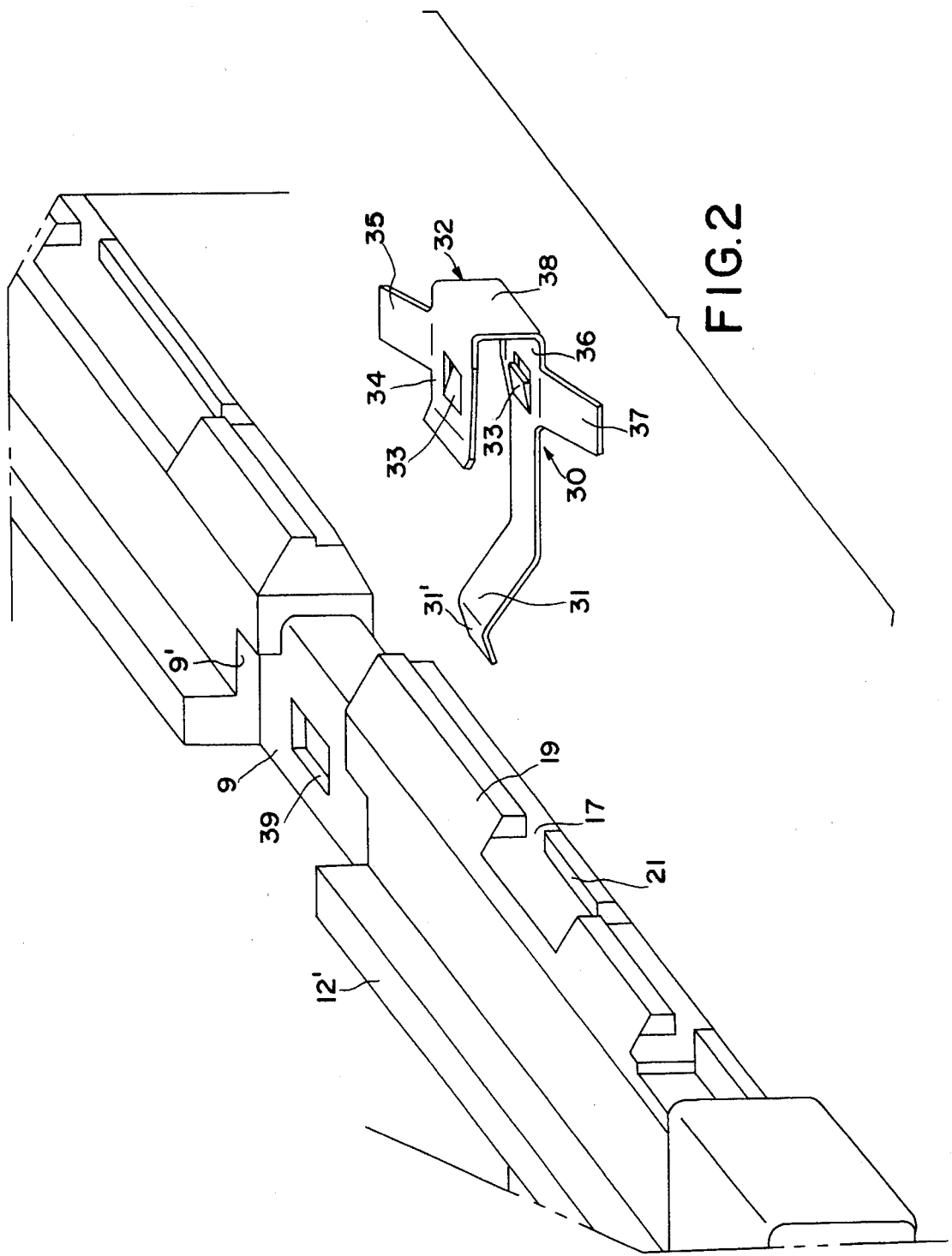
FIG. 2 is an enlarged perspective view of the bottom grounding clip and the corresponding portion of the frame of the I/O card assembly of FIG. 1.

Also referring to FIG. 2, a bottom grounding clip 30 for grounding the circuit traces on the bottom surface of the PC board 28 is received within a recess 9 in the right side arm 12' of the frame. The clip 30 has a generally lying U-shaped main body 32 including a top wall 34, a bottom wall 36 and a side wall 38 intermediating therebetween. A pair of retaining projections 33 respectively extend, of the top wall 34 and the bottom wall 36, to each other. Correspondingly, a pair of orifices 39 (only one shown) are respectively positioned under the top surface and the bottom surface of the side arm 12' for retainably receiving such retaining projections 33 therein so that the bottom clip 30 can be retained within the recess 9. An upwardly deflected engaging tang 31 integrally extends from the front end of the top wall 34 of the clip 30 into an interior of such base 14, and the tip 31' of the tang 31 is adapted to abut against the grounding pad (not shown) on the bottom surface 27 of the board 28. A first tongue 35 slantingly extends upward from the first side edge of the top wall 34 and is adapted to be substantially received within an indent 9' proximate the top surface of the right side arm 12' for engagement with the corresponding portion of the top cover 11 and a second tongue 37 slantingly extends downward from the opposite second side edge of the bottom wall 36 and is adapted to be received within an indent (not shown) proximate the bottom surface of the right side arm 12' for engagement with the corresponding portion of the bottom cover 13, so that the grounding path of the circuit traces on the bottom surface 27 of the board 28 can be established through the engaging tang 31 and the first and second tongues 35, 37 of such grounding clip 30 to the top and the bottom covers 11, 13 wherein such top and bottom covers 11, 13 eventually contact grounding means in a host connector, i.e., a memory card connector, in a computer set, for grounding.

Figure 3:
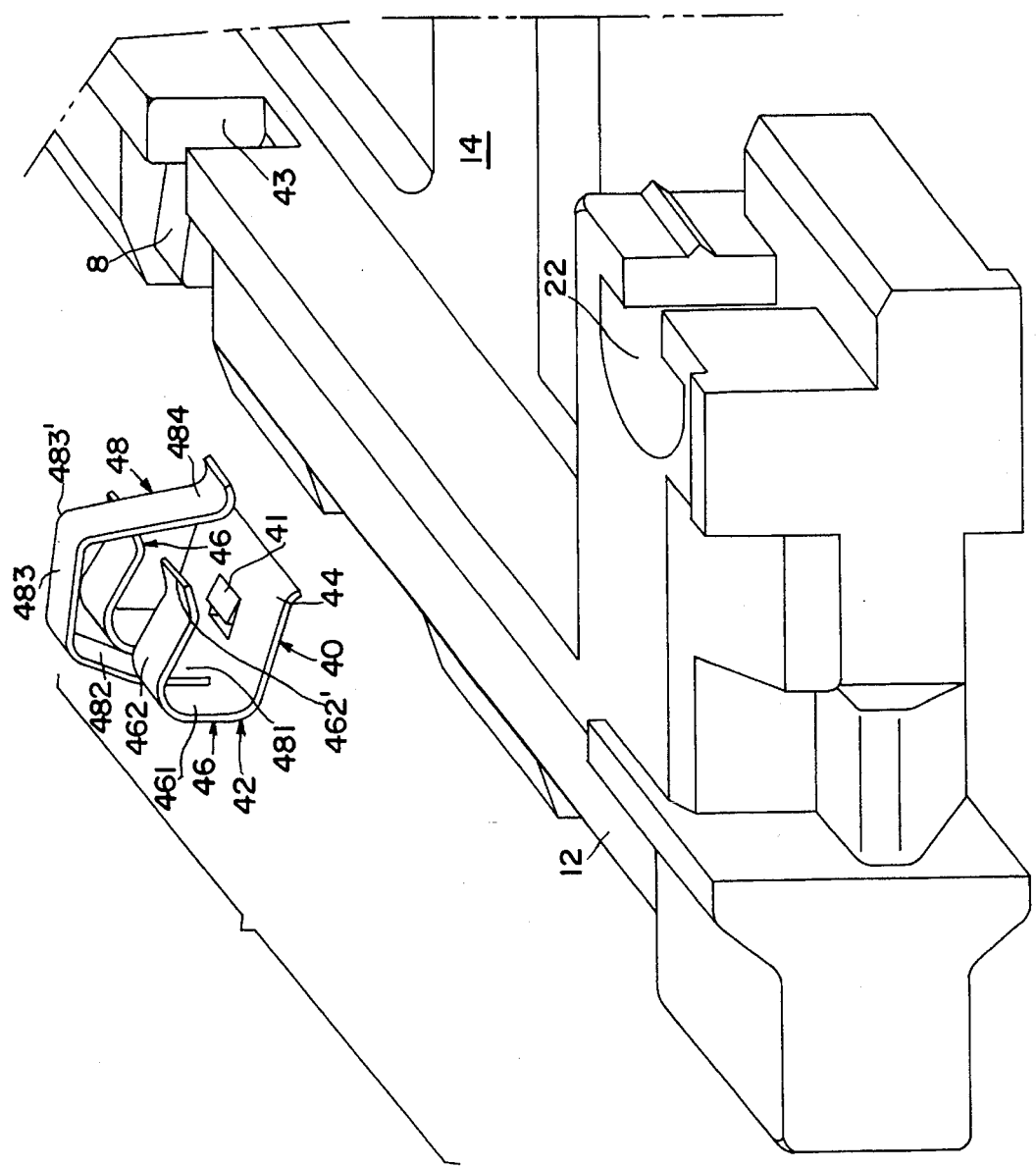
FIG. 3 is an enlarged perspective view of the top grounding clip and the corresponding portion of the frame of the I/O card assembly of FIG. 1.

Also referring to FIG. 3, similarly but more importantly, a top grounding clip 40 for grounding the circuit traces on the top surface 29 of the PC board 28 is retainably disposed in a recess 8 in the left side arm 12 of the frame 10. The top grounding clip 40 has a generally U-shaped main body 42 including a bottom wall 44 of which a retaining projection 41 extends upwardly for retainable reception within an orifice (not shown), which is located under the bottom surface of the right side arm 12, for retaining the top grounding clip 40 in position in the recess 8. A pair of opposite curved spring arms 46 integrally extend from two sides of the outermost edge of the bottom wall 44 first upwardly to form first portions 461 and successively inwardly horizontally to form second portions 462. The curved spring arms 46 cooperate with the bottom wall 44 to form the basic structure of the U-shaped main body 42 for receivably complying within the recess 8. An engaging tang 48 between the two spring arms 46 has a first section 481 integrally extends upwardly from the bottom wall 44, a second and a third sections 482, 483 in order successively inwardly and slantingly wherein the second section 482 and the third section 483 are positioned above the second section 462 of the spring arm 46 in a distance, and the distal end 483' of the third section 483 inwardly, i.e., in the direction toward the center of the I/O card 1, extends out of the tip 462' of the second section 462 of the spring arm 46. A fourth section 484 further integrally projects slantingly downward from the end 483' of the third section 483 until the tip 484 of the fourth section 484 is positioned proximate the middle vertical position between the second section 462 of the spring arm 46 and the bottom wall 44 of the top ground clip 40. To correspond to inward movement of extensible fourth section 484 of the top ground clip 40, the right side arm 12 has a notch 43 therein adjacent to the fourth section 484 of the top grounding clip 40 for allowing the deflected fourth section 484 of the top grounding clip 40 being able to be seated thereon and to slide therefrom to contact a grounding pad of circuit traces on the top surface 29 of the PC board 28 which is in the interior surrounded by the frame 10.

Figure 4:
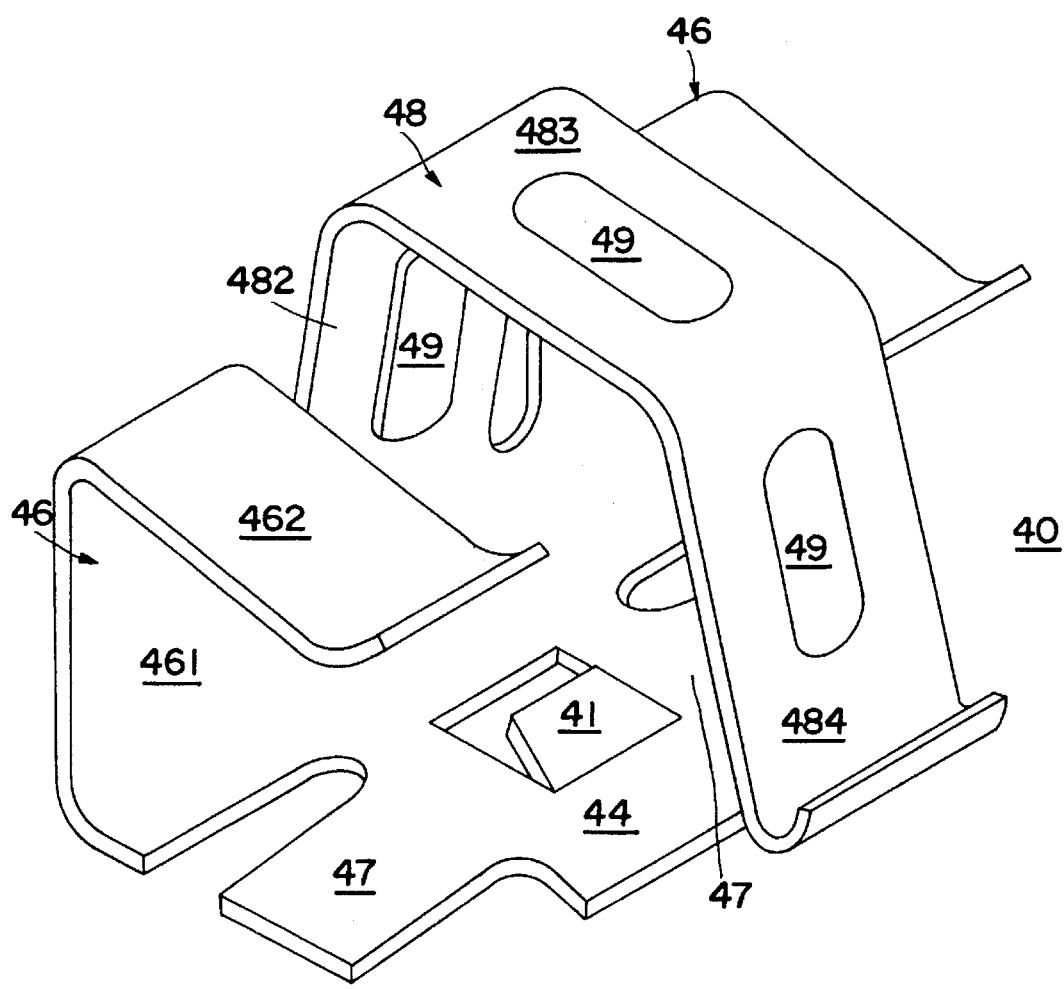
FIG. 4 is a perspective view of another embodiment of the top grounding clip.

FIG. 4 shows another preferred embodiment wherein in comparison with the first embodiment, the bottom wall 44 is cut-away at the four corners to form a pair of outwardly slantingly downward extending legs 47 from the center portion thereof for efficiently electrically abutting against the corresponding portion of the bottom cover 13 and that will be described in detail later. The second, third and fourth section 482, 483 and 484 further includes respectively ribs 49 thereof by coining process for reinforcement of the strength thereof.

It is understood that the bottom grounding clip 30 and the top grounding clip 40 are adapted to be securely pre-assembled to the frame 10 by means of the retaining projections 33, 41 thereof respectively retainably engaging within the corresponding orifices 39. Successively, the bottom cover 13 can be attached to the frame 10 from the bottom, through its resilience, with the hooks 15 thereof engaging within the slots 17 in side arms 12, 12' of the frame 10. The frame 10, the bottom cover 13, the bottom grounding clip 30 and the top grounding clip 40 are assembled as a preassembly in a semi-finished manner. Such pre-assembly accompanying the separate unattached socket connector 16 and I/O connector 18 and the top cover 11, is shipped to an I/O card manufacturer who fabricates the heart component of the I/O card, i.e., PC board 28.

In a later time, at I/O card manufacturer's place, the PC board 28 is fastened to the frame 10 of such pre-assembly, and the socket connector 16 and the I/O connector 18 are adhered to two opposite edge portions thereof by surface mount process wherein the engaging ears 24, 26 of the connectors 16, 18 are respectively retainably received within the corresponding cavities 20, 22 in the side arms 12, 12' so that the PC board 28 and its associated connectors 16, 18 can be securely positioned in the frame 10. Finally, similar to the bottom cover 13, the top cover 11 is attached to the frame 10 from the top, through its own resilience, with hooks 15 retainably engaging within the slot 17 in the side arms 12, 12' of the frame 10.

Figure 5A:
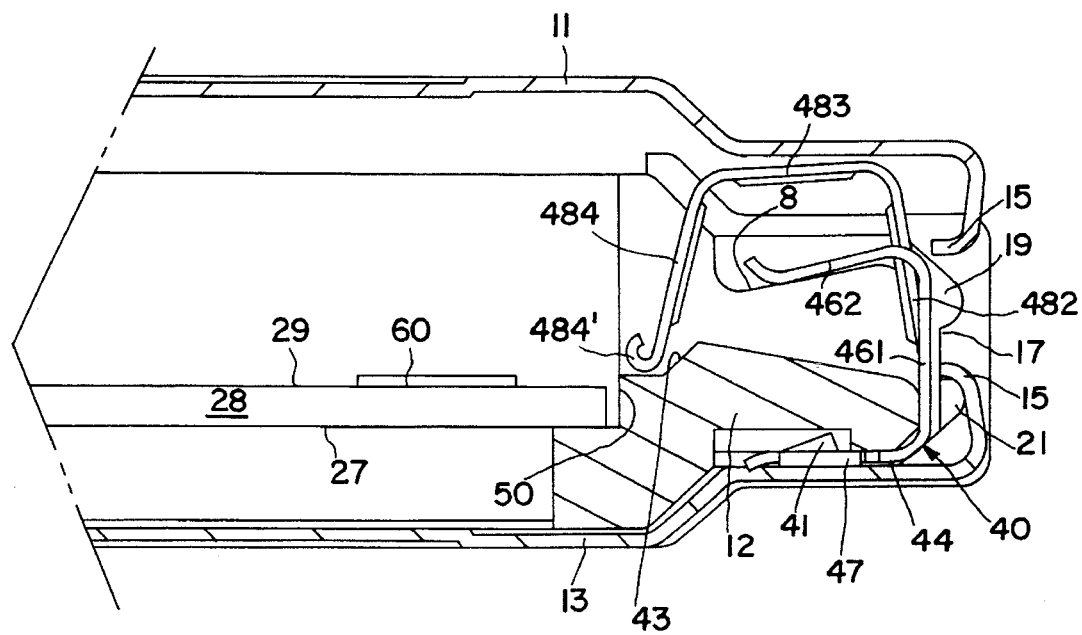
FIG. 5(A) is a fragmentary cross-sectional view of the I/O card assembly of FIG. 1 incorporating the top grounding clip of FIG. 2 in a contraction manner.
Figure 5B:
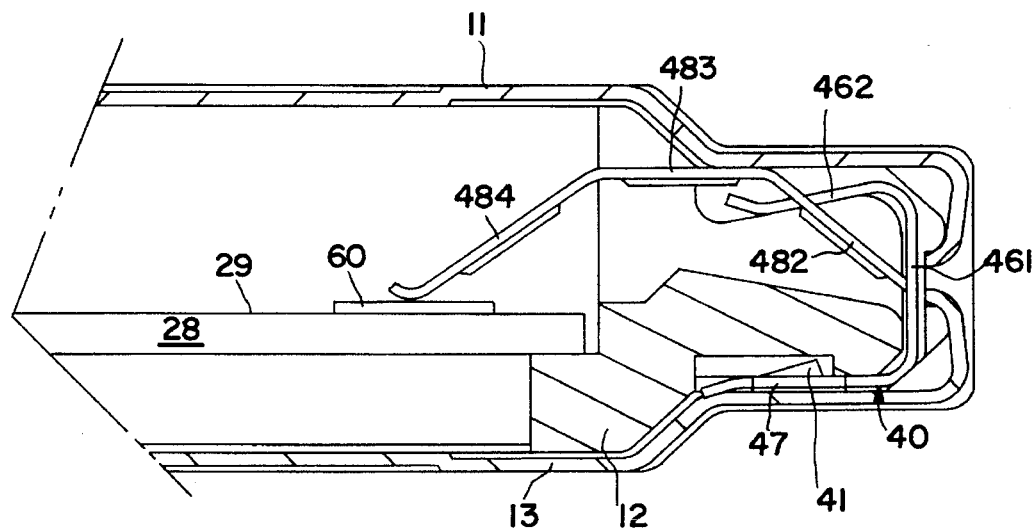
FIG. 5(B) is a fragmentary cross-sectional view of the I/O card assembly of FIG. 1 incorporating the top grounding clip of FIG. 2 in an extension manner.

FIGS. 5(A) and 5(B) depict the feature of the invention wherein FIG. ?? shows that the tip 484' of the fourth section 484 of the top grounding clip 40 stand in a contraction manner behind the inner edge 50 of the side arm 12 when the top cover 11 is not attached to the frame 10, so that the PC board can be easily loaded onto the base 14 of the frame 10 from the top without any obstacle. In contrast, when the top cover 11 is attached to the frame 10 from the top, the third section 484 is pressed downward by the corresponding portion of the top cover 11 and thus the fourth section 484 is forced to move forwardly, i.e., inwardly under the situation that the tip 484' of the fourth section 484 slide along the top surface 29 of the PC board 28 until it is designedly positioned on the top of the predetermined grounding pad 60 of the circuit traces on the top surface of the PC board 28. In this condition, the top grounding clip 40 is in an extension manner.

It can be seen that the grounding effect can be achieved from the grounding pad 60 on the board 28 through the third section 483 of the top grounding clip 40 to the top cover 11 and/or through the legs 47 to the bottom cover 13. As aforementioned, the metal top cover 11 and the metal bottom cover 13 can electrically and mechanically engage the grounding tangs of a host connector (not shown), i.e., a memory card connector, which is positioned in a computer set, for grounding when the end of the socket connector 16 of the I/O card 1 is inserted into such corresponding memory card connector.

It is appreciated that the present invention focuses on the structure of the I/O card using the top or bottom cover to be a grounding path for the whole circuit design. Accordingly, the top grounding clip for the circuit on top surface of the PC board is required to implement this design. Understandably, some other designs position the grounding pad close to the socket connector 16 and use a portion of the socket connector 16 to be grounding means instead of the metal cover being a portion of the grounding path. In such situation, the grounding clip may not be required. Anyhow, the present invention is preferred to be applied to the I/O card of which a grounding pad of such internal PC board's circuit layout is configured far away from the socket connector 16 but close to the edge of the board 28.

While the present invention has been described with reference to a few specific embodiments, the description is illustrative of the invention and is not to be construed as limiting the invention. Various modifications to the present invention can be made to the preferred embodiment by those skilled in the art without departing from the true spirit and scope of the invention as defined by the appended claims.

Therefore, persons of ordinary skill in this field are to understand that all such equivalent structures are to be included within the scope of the following claims.

What is claimed is:

1. An I/O card assembly for use with a computer, comprising:

a rectangular frame sandwiched between a top cover and a bottom cover;

at least a connector positioned at one end of said I/O card assembly to be an interface with the computer;

a PC board disposed on the frame within the I/O card assembly, said PC board having circuit traces at least on a top surface thereof for electrically connecting with said connector;

at least a top grounding clip for grounding said circuit traces on the top surface of the PC board, being attached to the frame wherein a front end portion of said top grounding clip generally stands on the frame in a contraction manner for allowing for loading the PC board from the top, and such front end portion of said top grounding clip can be forced, by pressing of the top cover, to extend into an interior of the frame for electrically engaging a predetermined grounding pad of said circuit traces on the top surface of the PC board when the top cover is secured to the frame from the top, so that through the top grounding clip, a grounding path is established from the grounding pad to the top cover.

2. The I/O card assembly as described in claim 1, wherein a bottom grounding clip is attached to the frame for grounding circuit traces on a bottom surface of the PC board.

3. The I/O card assembly as described in claim 1, wherein said frame includes two opposite side arms having cavities to retainably receiving engaging ears of the connector and having recess for retainably receiving the corresponding grounding clip therein.

4. The I/O card assembly as described in claim 1, wherein a notch is positioned in the frame for allowing extension of the front end portion of the top grounding clip into the interior of the frame.

5. The I/O card assembly as described in claim 1, wherein said top cover and bottom cover have hooks at edges to engage within corresponding slots in the periphery of the frame.

6. The I/O card assembly as described in claim 1, wherein said top grounding clip includes a generally U-shaped main body including a bottom wall from which a retaining projection extends upwardly for retainable reception within an orifice in the frame, a pair of curved spring arms integrally extending upwardly from said bottom wall so that said spring arms incorporate the bottom wall to be compliantly received within a corresponding recess in the frame, and a deformable engaging tang integrally extending upwardly from the bottom wall whereby said engaging tang can be depressed by downward movement of the top cover and the front end portion of the top grounding clip, which is of said engaging tang, can move into the interior of the frame when said engaging tang is in an extension manner.

7. The I/O card assembly as described in claim 2, wherein said bottom grounding clip includes a generally U-shaped main body comprising a top wall, a bottom wall and a side wall intermediating therebetween, a pair of retaining projections respectively extending of the top wall and the bottom wall to each other for retainable reception within a pair of corresponding orifice in the frame, an upwardly deflected engaging tang integrally extending from a front end of the top wall being adapted to abut against a grounding pad of the traces on the bottom surface of the PC board, and at least a tongue slantingly extending from one side edge of one of the top wall and the bottom wall and adapted to be received within a corresponding indent for electrical engagement with one of the top cover and the bottom cover.

8. A grounding clip for use with an I/O card assembly for grounding circuit traces on a top surface of an internal PC board of said I/O card assembly, comprising:

a main body for retaining said grounding clip in said I/O card assembly;

a deformable and deflectable means integrally extending from said main body whereby said deflectable means is in a contraction manner when a metal top cover of said I/O card assembly is not attached to a frame of said I/O card assembly, and is in an extension manner when said metal top cover is attached to said frame of said I/O card assembly from the top wherein a front end portion of said means can forwardly move to electrically engage a grounding pad of said circuit traces on the top surface of the PC board and the top cover abuts against said grounding clip so that a grounding path of said I/O card assembly is achieved through said grounding clip.

9. The grounding clip as described in claim 8, wherein said main body of said grounding clip is in a form of U-shape including a bottom wall from which a retaining projection extends upwardly and a pair of curved spring arms integrally extending from the bottom wall.

10. A semi-finished pre-assembly of an I/O card for use with a computer, comprising:

a rectangular frame;

a bottom cover attached to said frame from the bottom; and a top grounding clip for grounding circuit traces of a top surface of an internal PC board which is adapted to be attached to said frame in a later time, said top grounding clip being pre-assembled to said frame before said PC board is ready to mount on said frame, wherein said grounding clip substantially constitutes no obstacle for loading said PC board onto the frame from the top side of the frame, wherein said frame includes a pair of opposite side arms one of which said top grounding clip is seated on, and said top grounding clip includes a defomable deflected engaging tang whereby a front end of said engaging tang does not extend out of an inner edge of said frame for allowing top-loading of said PC board onto the frame when no top cover is attached to said frame, but extends into an interior of said frame to mechanically and electrically engage a grounding pad on a surface of the PC board when the top cover is attached onto the frame from the top and mechanically presses down said engaging tang.

11. The semi-finished pre-assembly as described in claim 10, wherein said frame further includes a notch for allowing the front end of said engaging tang to be seated thereon in a contraction manner, and to inwardly move therefrom into the interior of said frame.

12. The semi-finished pre-assembly as described in claim 10, wherein said pre-assembly further includes a bottom grounding clip attached onto another side arm opposite to said top grounding clip for grounding circuit traces of a bottom surface of said internal PC board.

13. The semi-finished pre-assembly as described in claim 10, wherein said top grounding clip can mechanically and electrically engage the top cover and the bottom cover to establish a reliable grounding path when said I/O card is completely assembled.

14. An I/O card assembly for use with a computer, comprising:

a rectangular frame sandwiched between a top cover and a bottom cover;

at least a connector positioned at one end of said I/O card assembly to be an interface with the computer;

a PC board disposed on the frame within the I/O card assembly, said PC board having circuit traces on a top surface and a bottom surface thereof for electrically connecting with said connector;

at least a bottom grounding clip for grounding said circuit traces on the bottom surface of the PC board, being attached to the frame wherein said grounding clip includes a main body from which an upwardly engaging tang integrally extends inwardly in order to abut against a corresponding grounding pad of said circuit traces on the bottom surface of the PC board, and from which at least one tongue extends for conductive engagement with a corresponding portion of at least one of the covers, and wherein said main body of said grounding clip has generally a U-Shaped configuration including a top wall, a bottom wall and a side wall intermediating therebetween, said engaging tang extending from the bottom wall, said tongue extending from one of the top and bottom walls, and at least a retaining projection extending from one of the top and bottom walls.

15. The I/O card assembly as described in claim 14, wherein said frame includes a recess for receiving said main body of the grounding clip therein, at least an orifice for receiving said retaining projection therein, and at least an indent for receiving said tongue therein.

* * * * *